United States Patent [19]

Mundt

[11] Patent Number: 5,137,701
[45] Date of Patent: Aug. 11, 1992

[54] APPARATUS AND METHOD FOR ELIMINATING UNWANTED MATERIALS FROM A GAS FLOW LINE

[76] Inventor: Randall S. Mundt, 4965 Garden Trail, Colorado Springs, Colo. 80907

[21] Appl. No.: 651,571

[22] Filed: Sep. 17, 1984

[51] Int. Cl.$^5$ .................................. B01D 53/34
[52] U.S. Cl. ................... 423/210; 204/157.3; 423/240 R; 423/241; 423/DIG. 8; 423/DIG. 10; 423/240 S
[58] Field of Search .......... 204/155, 157.1 R, DIG. 1, 204/164, 177; 423/210 R, 210 M, 210 S, 210 C, 240 R, 240 S, 241, DIG. 8, DIG. 9, DIG. 10, 492, 491, 493

[56] References Cited

U.S. PATENT DOCUMENTS

| | | | |
|---|---|---|---|
| 85,370 | 12/1868 | Deacon | 423/502 |
| 2,837,654 | 6/1958 | Berghaus et al. | 204/164 |
| 2,931,710 | 4/1960 | Leffler | 423/240 S |
| 3,003,939 | 10/1961 | Rouy et al. | 204/164 |
| 3,004,137 | 10/1961 | Karlovitz | 204/164 |
| 3,012,954 | 12/1961 | Fahnoe | 204/164 |
| 3,682,585 | 8/1972 | Frevel et al. | 423/240 S |
| 4,082,834 | 4/1978 | Grossman et al. | 423/210 S |
| 4,198,384 | 4/1980 | Robinson | 423/240 |

FOREIGN PATENT DOCUMENTS 814876  3/1981  U.S.S.R. .......................... 423/493

OTHER PUBLICATIONS

Encyclopedia of Chemical Technology, 3rd ed., Supplement Volume, Kirk-Othmer, eds. John Wiley & Sons, 1984, pp. 602, 603, 614-615.
Encyclopedia of Chemical Technology, 3rd ed., Supplement Volume Ed. by Kirk-Othmer, John Wiley & Sons 1984, pp. 601, 605.
Basic Chemistry and Mechanisms of Plasma Etching. Flamm et al. J. Vac. Sci. Technol, Jan.-Mar. 1983, pp. 23-30.

*Primary Examiner*—Jeffrey Edwin Russel
*Attorney, Agent, or Firm*—Timothy J. Martin

[57] ABSTRACT

An apparatus and method for eliminating unwanted materials, such as corrosive gases, from an effluent gas flow line includes a reactive trap wherein chemical reaction between the unwanted material, a reactant gas and a reactive element takes place under induced plasma conditions. A ballast gas may be added to adjust operating pressures and to aid in creating the plasma. The reactant gas and the reactive element are selected so that relative harmless by-products are produced. The reactive element is preferably maintained at a temperature of approximately 400° C. and the chemical by-products are passed through a condensation element in the reactive trap which element is maintained at approximately 30° C. Preferably, the plasma is induced by a microwave transmitter in conjunction with a waveguide inserted into a reactive trap, and a control system automatically monitors and adjusts the temperature and pressure of the reaction as well as controls the ratio of effluent gas and ballast gas.

8 Claims, 2 Drawing Sheets

APPARATUS AND METHOD FOR ELIMINATING UNWANTED MATERIALS FROM A GAS FLOW LINE

BACKGROUND OF THE INVENTION

The present invention relates to the elimination of unwanted materials from a gas flow line, such as materials generated in or present as unreacted process additives in low pressure fabrication processes. In such low pressure processes, an effluent is removed from the process reaction vessel by a vacuum pump system so that protection of the vacuum pump system from harmful materials can be quite important. The present invention, then, is directed to an apparatus and a method for removing the unwanted materials in the effluent whereby the effluent may be more easily handled by and less destructive to the pump system. This system is especially constructed to remove corrosive gases present in the effluents.

One example of a technology which may readily implement the present invention is the semiconductor fabrication industry. This industry is making increased use of low pressure operations such as plasma etching, plasma assisted deposition and the like. These processes require sophisticated vacuum pumping systems having expensive parts and often using expensive, inert pump oil. Since corrosive gases are utilized in these processes, the unreacted gases or the reaction by-products of these gases can be harmful to the pump system; it is thus desirable that they be treated prior to their passage into the pump mechanism. Presently, treatment of these unwanted materials is done in two ways.

Perhaps the most common technique and practice in the semiconductor industry utilizes a liquid nitrogen cold trap inserted into the gas line between the process reaction vessel and the mechanical vacuum pump system. By passing the process effluent through the cold trap, which is maintained at extremely low temperature, the gaseous additives and by-products are condensed before they reach the vacuum pump system where they would either react with its metal parts, thereby damaging the pump, become entrained in the pump oil or exit into the environment.

While liquid nitrogen cold traps enjoy widespread use, this technique of treating dangerous effluents nonetheless has several major drawbacks. One disadvantage is the high energy cost involved due to the extensive utilization of liquid nitrogen which, since it exists at a temperature of $-196°$ C., requires great expenditure of energy to produce. Another disadvantage is that, due to the regeneration time of the cold trap, it is necessary to use two traps for a single system so that they may be interchanged with one another whereby one of the traps is always "on line." This leads to inefficient equipment utilization and may double the cost of the by-product treatment system. A safety hazard exists in the cold trap systems since the trap concentrates the dangerous effluents. Any event which increases the temperature of the trap, such as a power outage or liquid nitrogen loss, may initiate an explosive chemical reaction. This danger is also present when the cold trap is regenerated since it must be warmed up prior to introducing new liquid nitrogen. Yet another drawback is that the materials condensed in the nitrogen cold trap still need to be neutralized; until they are neutralized, these materials remain dangerous to handle and to dispose.

A second common technique utilized to protect the mechanical pump system involves an approach wherein the mechanical pump system is made as an inert as possible. In such systems, all of the exposed pump parts are typically coated with Teflon, and inert pump oils and neutralizing filters are employed. In addition, the user regularly purges the oil system with high volumes of inert oil.

This second technique also has many drawbacks. For example, there is a substantial increase in the pump equipment cost since the parts must be Teflon-coated. Also, the cost of inert pump oil is quite high, costing hundreds of dollars per liter, so that a simple oil change may cost several thousand dollars. Another drawback is present since the pump system cannot be made truly inert; thus one who utilizes this technique merely reduces the frequency of major overhauls. Again, safety is a consideration since both the pump discharge and the pump oil can contain significant concentrations of the undesired and dangerous materials. Exposure to the oil during oil changes and the potential for oil spills both present potentially hazardous situations. Finally, as in the case with the cold trap, the oil must be treated to neutralize absorbed hazardous chemicals prior to disposal.

Accordingly, there is a significant need for an apparatus and process that can reduce or eliminate unwanted materials, such as corrosive gases, that may be present or produced during manufacturing processes or otherwise present in a gas flow line. There is a need for such a system that accomplishes the reduction of these hazardous materials in a more cost-efficient manner and that increases the safety of persons operating the system. The present invention addresses these needs.

SUMMARY OF THE INVENTION

It is an object of the present invention to provide an apparatus and method for reducing the amount of various unwanted materials prior to their introduction into a pumping system.

It is another object of the present invention to provide an new and useful apparatus and method for eliminating corrosive gases from a gas line in a safe, economical manner.

It is a further object of the present invention to provide an apparatus and method for removing dangerous or unwanted materials present in low pressure manufacturing processes in a safe, efficient, relatively inexpensive manner before they reach a vacuum pump system so the vacuum system is protected while at the same time permitting relative ease in handling and disposing the by-product discharge.

Yet another object of the present invention is the reduction of the dangerous properties of gaseous effluent materials, such as chlorine and flourine based corrosives, produced or present in manufacturing operations by chemically reacting the effluent to eliminate their presence in a gas flow line.

To accomplish these objects, the present invention broadly includes an apparatus having a reaction chamber that is inserted in the flow line between a process reaction that produces an undesirable or dangerous effluent and a vacuum pump that maintains the process reaction at a low pressure. Naturally, the present invention may be used in any gas flow line carrying unwanted corrosive gases, but the present invention is specifically adaptable to manufacturing processes used in the semiconductor industry, such as plasma etching, plasma assisted deposition, and the like which employ chlorine or fluorine based compounds.

The apparatus, which is inserted into the gas flow line, includes one or more control valves which mix a reactant gas from a reactant gas source with the effluent from the process reaction to form a mixed gas product; the control valves are thus connected both to the process reaction and to the plasma gas source. A ballast gas may also be mixed into the mixed gas product. This mixed gas product is introduced through an inlet into a reaction chamber that is in the form of a hollow housing having a flow path therethrough. The reaction chamber includes at least one mesh of fibrous material that defines a reactive mesh through which the mixed gas product is passed afterwhich it is discharged through the chamber's outlet to the vacuum pump system; preferably an outer condensation mesh is utilized along with the reactive mesh.

During the passage of the gas mixture through the reaction chamber, a glow discharge is induced in the gaseous material to generate a plasma and thus to enhance interaction among the mixed gases and the reactive mesh. This interaction is selected to be the chemical breakdown of the mixed gases into more manageable components or into a chemical product that is inert or nonflammable. The reactant gas and the composition of the reactive mesh are selected to be substances which will react chemically with the unwanted material so as to produce chemical by-products that are less volatile, corrosive or toxic so that the by-products can either be passed through the vacuum pump without damage thereto or so that they will remain in a solid, particulate form in the trap mesh.

According to the preferred form of this invention, then, the effluents from the process reaction as well as the reactant gas and ballast gas are premixed through a control valve prior to introduction to the inlet of the reaction chamber. The ballast gas is provided to adjust the pressure of the system and to couple radiant energy from an energy source to create a plasma within the reaction chamber. A pressure sensor is provided adjacent the inlet of the reaction chamber and a temperature probe is inserted into the reaction chamber. Both the pressure data and the temperature data are fed to a control system, such as a microprocessor, which operates the control valve or valves so that the desired gas mixture is achieved prior to its introduction into the reaction chamber.

The structure of the reaction chamber is defined by a hollow housing which contains a cylindrical baffle. A quartz tube is inserted axially within the chamber in spaced apart relation from the baffle cylinder and is open to the exterior of the housing. This tube acts as a wave guide for radiant energy from the radiant energy source which is a microwave or radio transmitter controlled by the control system. A first fibrous mesh of material, in the form of an inner hollow cylinder, is mounted between the quartz tube and the baffle cylinder and forms a reactive mesh which chemically reacts with the corrosive gases. An annular space is provided between the reactant mesh and the wave guide tube in order to provide a plasma region. A temperature probe is inserted in the reactive mesh in the plasma region. A second, outer cylinder mesh of fibrous material is axially mounted in the chamber radially outwardly of the baffle cylinder so that the baffle cylinder lies between the two cylinders of fibrous material. The second mesh forms a condensation mesh that completely fills the volume between the baffle cylinder and the interior surface of the reaction chamber. By positioning the inlet and outlet of the reaction chamber on opposite sides of the baffle cylinder, the mixed gas is forced to flow from the inlet, through the first fibrous mesh and plasma region, around the baffle cylinder, after which it travels through the condensation mesh before exiting through the outlet connected to the vacuum pump. This construction provides a radial temperature gradient from a high temperature core to a lower temperature outer housing side wall.

From the foregoing, the preferred method of the present invention is one for eliminating unwanted materials in an effluent prior to their entry into a pump system. The method broadly comprises the steps of inducing a plasma in those materials in the presence of a reactive material and maintaining the plasma by means of a glow discharge so that a temperature gradient is established through an inner reactive mesh and an outer condensation mesh that collects more manageable interaction by-products. The method may further include the steps of introducing a reactant gas and a ballast gas along with the process effluent and generating a glow discharge to create a plasma at a location adjacent a reactive metal so that a chemical reaction occurs to produce less dangerous by-products. The reactive mesh and the reactive gas are selected to produce reaction by-products that have a vapor pressure greater than $10^{-3}$ torr at 400° C. and a vapor pressure less than $10^{-2}$ torr at 30° C.

These and other objects of the present invention will become more readily appreciated and understood from a consideration of the following detailed description of the preferred embodiment when taken together with the accompanying drawings, in which:

DETAILED DESCRIPTION OF THE PREFERRED EMBODIMENT

The present invention is directed to protective apparatus that is adapted to be inserted into a gas line, for example, in a low pressure manufacturing operation. Particularly, this apparatus is constructed to help remove unwanted corrosive gases, such as chlorine and flourine based gases, from the flow line prior to their introduction into a mechanical device, such as a vacuum pump system. These unwanted corrosives may be by-product effluents or unreacted gases that are generated or employed in the manufacturing process and that could damage the mechanical integrity of the pump system or which could otherwise create hazardous situations.

Figure 2:
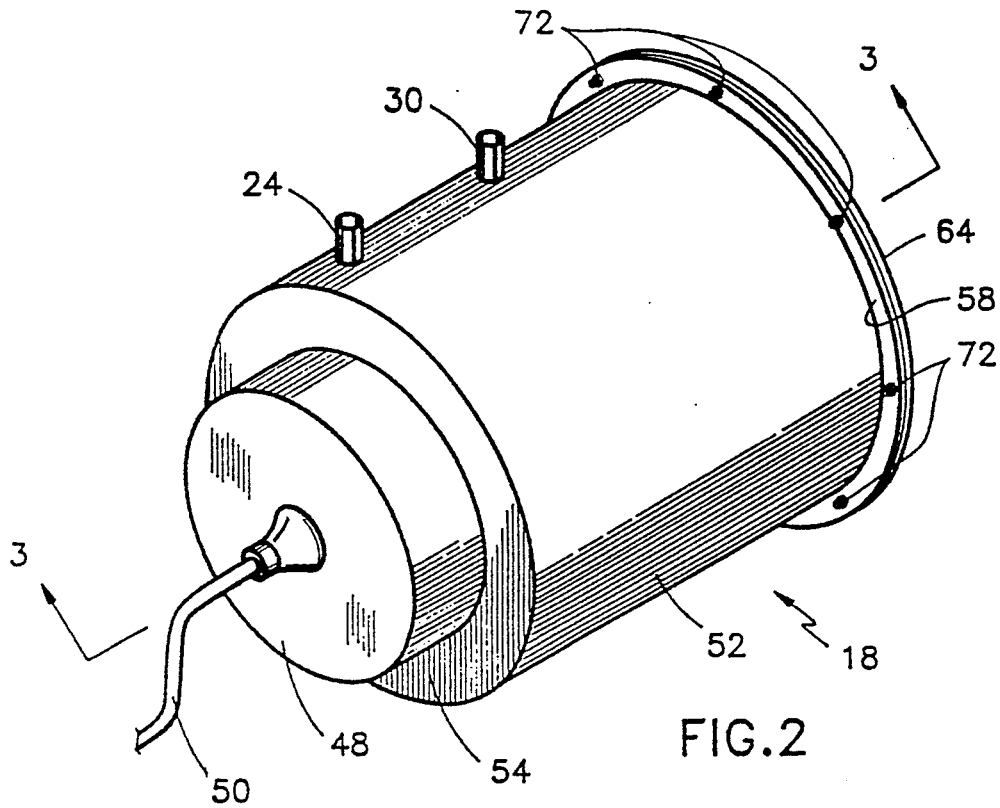
FIG. 2 is a perspective view of the reaction chamber forming an integral part of the present invention as is shown in the block diagram of FIG. 1.
Figure 3:
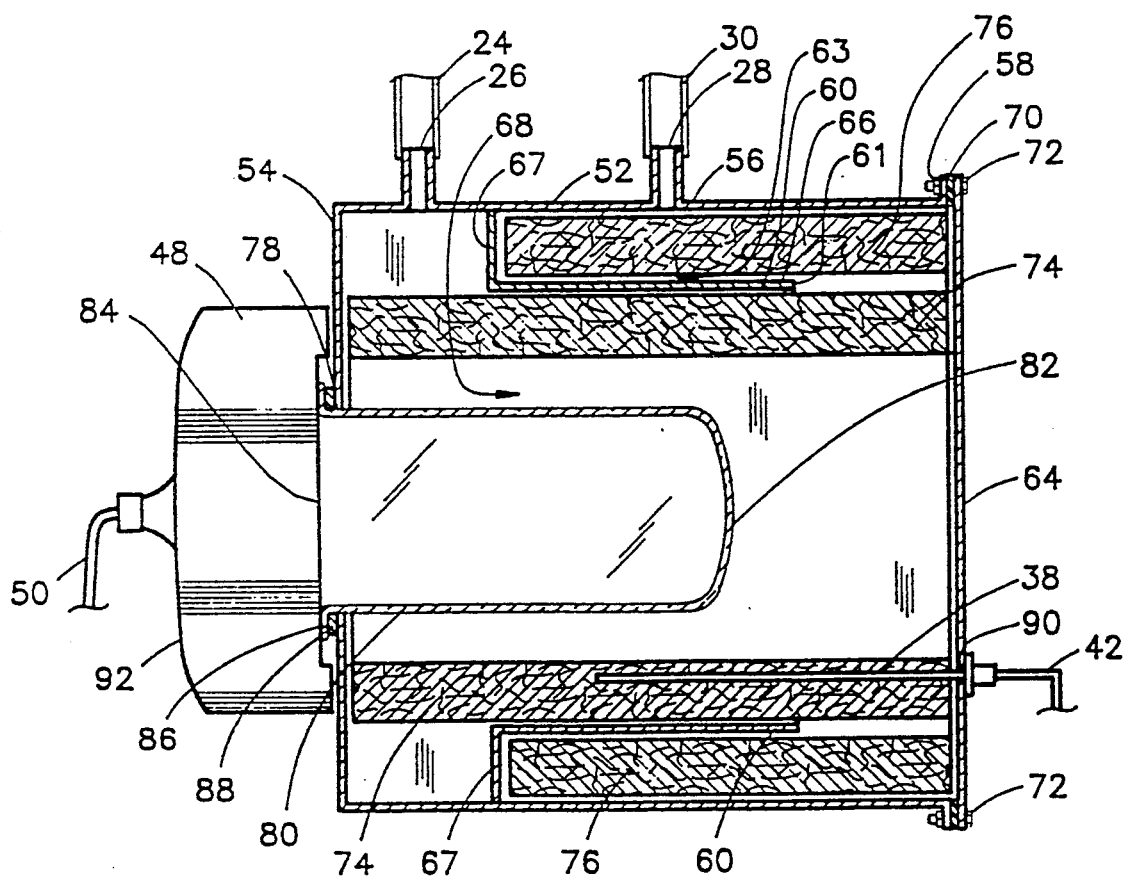
FIG. 3 is a cross-sectional view taken about lines 3—3 of FIG. 2.

The present invention is particularly adapted for use in the semi-conductor industry where fabrication techniques include the low pressure processes of plasma etching and vapor deposition. In such low pressure processes, a vacuum pump is connected, by means of a gas flow line, to a vessel where the process reaction takes place. The vacuum pump maintains the process reaction at low pressure by constantly evacuating the process reaction vessel. When unwanted materials are generated or present in these processes, these materials may damage the vacuum system as they are evacuated from the process reaction. The preferred embodiment of the present invention, then, acts as a protective apparatus for such a vacuum system and eliminates more expensive and dangerous techniques which are presently being employed. This invention is shown in FIGS. 1, 2 and 3 wherein the same numerals refer to the same elements.

Figure 1:
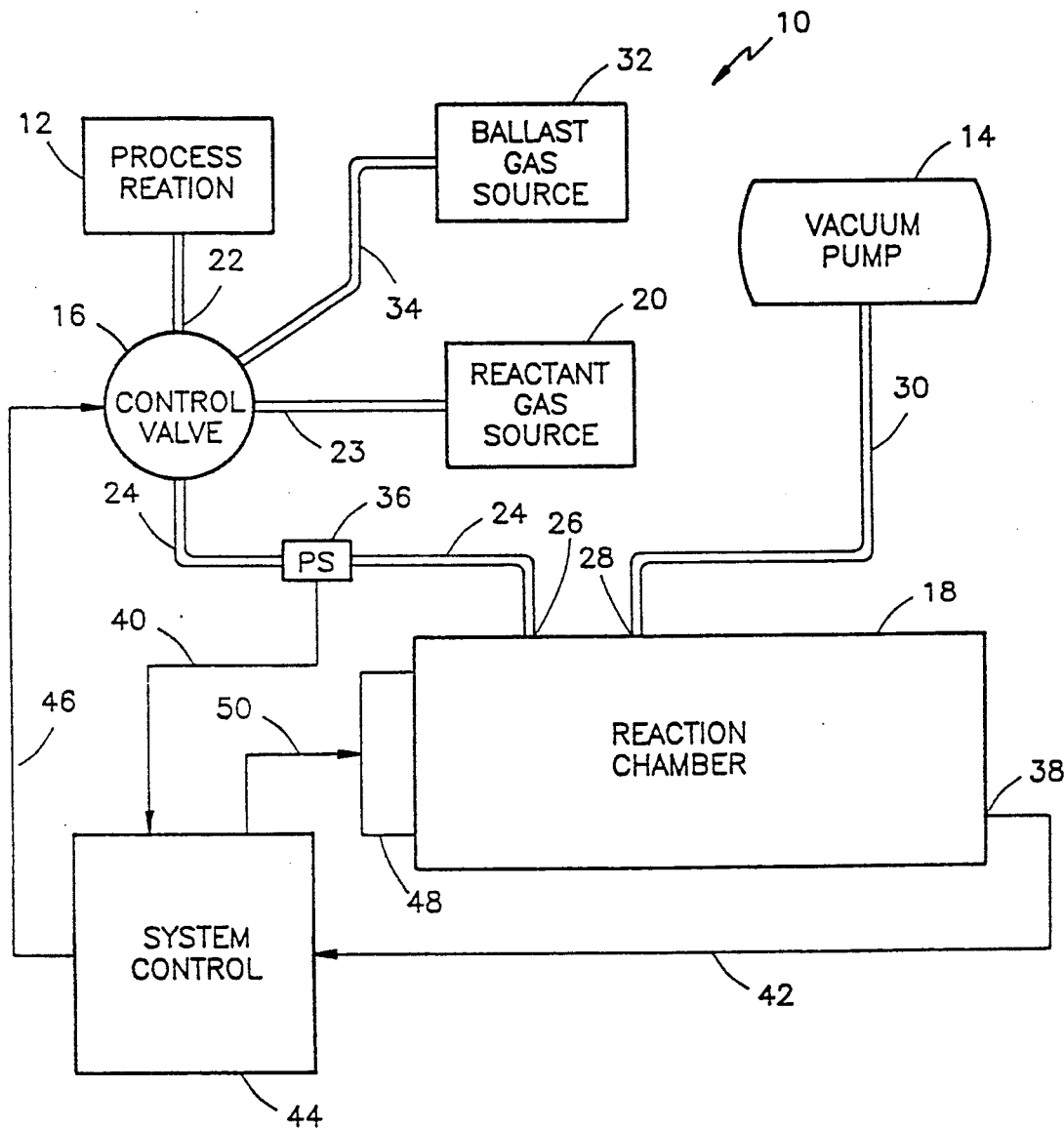
FIG. 1 is a block diagram showing the apparatus according to the preferred embodiment of the present invention interconnected between a process reaction and a vacuum pump system.

The apparatus according to the preferred embodiment of the present invention is shown in block diagram in FIG. 1 where it should be appreciated that protective apparatus 10 is inserted in a gas flow line extending between a process reaction vessel 12 and a vacuum pump 14 which operates on the reaction vessel 12 to maintain a relatively low pressure environment. The gas flow line between vessel 12 and pump 14 is interrupted by means of a control valve 16 and a reaction chamber 18. Reaction chamber 18 serves as an effluent trap, as more thoroughly discussed below. Control valve 16 allows introduction of interactive gases, such as a reactant gas from a reactant gas source 20 and a ballast gas from ballast gas source 32 with the process effluent from process reaction vessel 12 into the gas line to form a mixed gas product.

As is seen in FIG. 1, control valve 16 is connected to reaction vessel 12 by flow line 22, to plasma gas source 20 by flow line 23, and to ballast gas source 32 by flow line 34. The outlet of valve 16 is connected to inlet 26 of reaction chamber 18 by means of a flow line 24. Flow line 30 interconnects an outlet 28 of reaction chamber 18 to vacuum pump 14. Thus, flow lines 22, 24 and 30 form the gas flow line between process reaction vessel 12 and vacuum pump 14.

Sensing elements are provided to monitor the pressure and temperature of protective apparatus 10; these elements perform as part of the control system for the apparatus and method according to the preferred embodiment of the present invention. As is shown in FIGS. 1 and 3, these sensing elements include a pressure monitor 36 and a temperature monitor 38 placed in chamber 18, and both of these devices are of a type commercially available. Signals from pressure monitor 36 and temperature monitor 38 are fed, by way of electrical leads 40 and 42, respectively, to system control 44 which may be a microprocessor control assembly programmed to operate control valve 16 by producing control signals in response to the sensed temperature and pressure. System control 44 generates the signals that are passed along through electrical connection 46 to control valve 16 so that valve 16 may be adjusted to mix the desired proportion of the process effluent, the ballast gas and the reactant gas into the mixed gas product prior to introduction into reaction chamber 18. It should be appreciated that multiple control valve 16 could be replaced by a separate valve for each of the process gas, reactant gas and ballast gas without departing from this invention. System control 44 would then be programmed to operate the valves individually for the desired mixture. System control 44 also controls a radiant energy transmitter 48 through electrical connection 50. Transmitter 48, which is described in more detail below, may be selectively activated to induce a glow discharge in the gaseous medium on the interior of reaction chamber 18 so as to turn the introduced mixed gas product into a plasma at the core of reaction chamber 18.

The broad aspects of the operation of protective apparatus 10 as it is depicted in FIG. 1 can now be more fully understood. When a process reaction is initiated in vessel 12, vacuum pump 14 is activated and control valve 16 is set in a desired position so that effluent materials from reaction vessel 12 are drawn into flow line 22. Depending upon the setting of control valve 16, as dictated by system control 44, effluents from the process reaction in vessel 12 are mixed with controlled amounts of a selected reactant gas from reactant gas source 20 and a selected ballast gas from ballast gas source 32. The combined gas product is then drawn through inlet 26 and passes through reaction chamber 18. Gases from reaction chamber 18 are then exhausted through outlet 28 and into flow line 30 where they may be received by vacuum pump 14.

System control 44 monitors the pressure of the combined gas product by means of pressure monitor 36 and monitors the temperature interiorly of reaction chamber 18 by means of temperature monitor 38; in response to the pressure and temperature signals, system control 44 adjusts control valve 16 to a preselected mixture of gases and activates or deactivates radiant transmitter 48 to induce the glow discharge in reaction chamber 18. It should be appreciated that the activation of transmitter 48 will cause an elevation in temperature in chamber 18 by exciting the atoms of the combined gas product in order to produce a plasma. The removal of unwanted materials is enhanced by this plasma condition.

The structure of reaction chamber 18 is shown in greater detail in FIGS. 2 and 3. While these figures show the preferred embodiment of reaction chamber 18, it should be understood that other modifications of this structure are possible and are completely within the scope of this invention. In FIGS. 2 and 3, reaction chamber 18 is defined by a hollow cylindrical housing 52 constructed of any suitable material, such as steel, aluminum or iron. Housing 52 has an end wall 54 and a cylindrical side wall 56 through which inlet 26 and outlet 28 are formed as radially outwardly projecting ports. Side wall 56 terminates at an open end opposite end wall 54 in an outwardly projecting annular flange 58. A second end wall 64 closes the open end of chamber 18 and is in the shape of a flat disc having a diameter that matches the diameter of flange 58. A ring gasket 70 is inserted between flange 58 and end wall 64 with end wall 64 then being secured to flange 58 by a plurality of attachment screws 72 received in matching threaded holes in flange 58, gasket 70 and end wall 64.

A baffle member 60, preferably constructed of refractory mechanically stable insulator or of steel overlaid with an insulating layer, is positioned in the interior of reaction chamber 18 and is formed as a cylindrical sleeve having a side wall 66 and a shoulder 67 in the form of an outwardly projecting flange. Side wall 66 has a smaller diameter than side wall 56 so that baffle member 60 may be slideably inserted into the interior of housing 52. When this is done, the edge of shoulder 67 snuggly mates with the internal surface of side wall 56 with baffle 60 being sized so that shoulder 67 is between inlet 26 and outlet 28.

As is shown in FIG. 3, end wall 54 is provided with a circular opening 78 formed at its center. An elongated, hollow cylindrical tube 80 having a closed end 82 is inserted axially into the interior of reaction chamber 18 so that it is in spaced apart relation to baffle member 60. Tube 80 has a diameter slightly less than opening 78 and is preferably formed of quartz or aluminum. Tube 80 terminates at an open end 84 opposite closed end 82 in an outwardly projecting lip 86 so that it can be mounted to end wall 54 in any convenient manner. A vacuum gasket 88 is positioned between lip 86 and end wall 54 so that an air-tight seal is maintained when tube 80 is positioned in chamber 18. It should thus be appreciated that baffle member 60 and tube 80 force gas to flow inwardly from inlet 26, longitudinally through an annular passageway 68 between tube 80 and baffle member 60, outwardly around edge 61 of baffle member 60 and back through an annular passageway 63 between baffle member 60 and side wall 56 before exiting through outlet 28.

Also, as noted above, radiant transmitter 48 is mounted to reaction chamber 18 in order to create a glow discharge therein. To this end, as is shown in FIG. 3, radiant transmitter 48 includes a housing 92 which contains the electronics for radiant transmitter 48 which is connected, by means of electrical lead 50, to system control 44. Tube 80 serves to isolate transmitter 48 from reactions within chamber 18 and, with its quartz construction, acts as a wave guide for electromagnetic radiation produced by transmitter 48. End wall 64 of chamber element 52 has an offset hole 90 through which temperature monitor 38, in the form of a thermocouple, may be inserted. Temperature monitor 38 is secured to end wall 64 in any convenient air-tight manner, as is known in the art, and is electrically connected to system control 44 (shown in FIG. 1) by electrical lead 42, noted above.

To complete the assembly of reaction chamber 18, two tube-shaped masses of fibrous material are positioned inside of reaction chamber 18. Specifically, as is shown in FIG. 3, a first tube of fibrous mesh material, which has an outer diameter slightly less than the diameter of baffle member 60 is inserted into the interior of housing 52 and defines a reactive element 74. Tube 74 has a length slightly less than housing 52 so that it extends for almost the complete length of the interior of reaction chamber 18. A second tube of fibrous mesh material having an inner diameter slightly larger than baffle member 60 and an outer diameter slightly less than the inner diameter of side wall 56 is positioned in telescoping relation with baffle member 60 and defines a tubular condensation element 76. Tubular element 76 extends from shoulder 67 to end wall 64 and substantially fills annular passageway 63. It should be appreciated that baffle member 60 and tubular meshes 74 and 76 could be pre-assembled together as a replaceable filter unit for insertion into housing 52. Thermocouple 38 is longitudinally inserted into the body of fibrous tube 74.

In order to maintain unrestricted flow, it is desirable that the flow cross-sections in reaction chamber 18 be approximately a factor of ten larger than the flow cross-sections of inlet 26 and outlet 28. Thus, where the inlet/outlet cross-section is approximately 11.4 cm$^2$, the preferred embodiment of the present invention has a length of 30.5 cm Tube 80 preferably has a diameter of 10.0 cm and baffle member has a diameter of 20.0 cm so that a 5.0 cm annular passageway 68 is created between tube 80 and baffle member 60 when reaction chamber 18 is assembled. A 5.0 cm annular passageway 63 lies between side wall 56 and baffle member 60. Tube 76 completely fills passageway 63 and extends from shoulder 66 to end wall 64. Tube 74 has an inner diameter of 15.2 cm, an outer diameter slightly less than 20.0 cm and a length slightly less than 30.5 cm. Thus, tube 74 is spaced 2.5 cm away from tube 80 whereby an open annular plasma region is created at the core of reaction vessel 18. The contruction of reaction chamber 18 should be constructed in the relative proportions shown in FIG. 3; these proportions are selected to yield a 10:1 cross-section ratio where the fibrous meshes of tubes 74 and 76 are fifty percent meshes. These "fifty percent meshes" thus have a cross-section that is fifty percent open and fifty percent closed to a gas flow, as is commonly defined in the art.

In order to reduce or eliminate the undesired materials from the process effluent into less flammable, corrosive or toxic materials, the reactant gas, reactive element 74 and condensation element 76 interact with the effluent. This interaction is preferably a chemical reaction and the selection of the reactant gas and the composition of reactive tube 74 depends upon the reaction required to eliminate the corrosive gas in the effluent. In the chemical reactive process, the reactant gas and the reactive element 74 are selected based on a desired chemical reaction that generally produces a reaction product having a vapor pressure greater than 0.001 torr at 400° C. and less than 0.01 torr at 30° C. Condensation element 76 is employed to have a relatively cool larger surface that can condense unwanted materials after they leave the core plasma. Transmitter 48 is of a type commercially available, but is selected to be of sufficient power to maintain the plasma such that a core temperature at approximately 400° C. is produced.

As noted, chemical reactions are typically desirable where corrosive compounds are present in the effluent, either as a by-product of the process reaction or as unreacted process additives. These materials are usually chlorine based corrosives and fluorine based corrosives. In cases where chlorine and fluorine based corrosive gases are present in the effluent, it is desirable to oxidize them into relatively harmless materials. Examples of corrosive gases used in the semiconductor industry include $Cl_2$, $CCl_4$, $BCl_3$, $AlCl_3$, $CF_4$, $BF_3$, $WF_4$, $SiF_4$ and $SF_6$, but this list is not intended to be exhaustive of all types of corrosive gases that may be removed by this apparatus and method. Here, it is desirable to add an oxidant gas as the reactant gas from source 20. These reactant gases may include $O_2$, $CO_2$ and $NO_2$, but again, this listing is by way of example and other oxidizing gases may be used as well. The reactive element 74 which is preferred for chlorine based corrosives may be either an iron or zirconium mesh, while a zirconium mesh is preferred for fluorine based corrosives. Condensation element 76 may be of any stable heat conductive material, such as aluminum, that acts as a large, cool, condensation surface.

An example of one such reaction for carbon tetrachloride is as follows:

| Unwanted Material | Reactant Gas | Reactive Element | | |
|---|---|---|---|---|
| $3CCl_4$ + | $3O_2$ + | $4Fe$ | $\xrightarrow{\Delta}$ | $3CO_2 + 4FeCl_3$ |

In this reaction, the by-product $CO_2$ may be conveniently removed by the vacuum pump while the $FeCl_3$, which is relatively harmless, condenses on tube 76 for subsequent disposal. Ballast gas may be added as needed.

It should be appreciated that the reaction according to the preferred embodiments of the present invention are dependent upon the creation of a glow discharge within annular region 68 with this glow discharge being produced by transmitter 48. When transmitter 48 generates electromagnetic radiation, for example, microwaves, these waves are guided down quartz tube 80 so that they are relatively evenly dispersed throughout region 68. Ballast gas from ballast gas source 32 is introduced into reaction chamber 18 when needed to couple this electromagnetic radiation to the plasma, especially where the reactant gas and the process effluent are less responsive to the wavelength of the radiation. In effect, the atoms in the ballast gas become excited and collide with molecules of the effluent and reactant gas so that a plasma is produced in a plasma region 68.

In order to condense the interacted plasma by-products, a temperature gradient is maintained from the central axis of reaction chamber 18 radially outward to tubular mesh 76. The plasma is at a very high temperature sufficient to maintain tube 74 preferably at approximately 400° C. as a result of the glow discharge while the outer surface of reaction chamber 18 is preferably maintained at approximately 30° C. A cooling jacket may be utilized around side wall 56 for this purpose. It has been found that, by maintaining the temperature gradient, and by selecting interaction so that the products thereof have a vapor pressure of approximately $10^{-2}$ torr at 30° C., a substantial portion of the unwanted materials are removed and trapped by tube 76 before these materials may be passed to pump 14. The construction of reaction chamber 18 and the use of a tubular reaction element 74 and a tubular condensation element 76 permit cost savings since both elements can be conveniently replaced and may be disposed along with the interacted substances trapped by the tubular mesh.

From the above, it should also be appreciated that the method according to the preferred embodiment of the present invention comprises the steps to be performed by this system. More specifically, the method according to the preferred embodiment of the present invention is directed towards removing unwanted materials from a process reaction effluent by inducing a plasma in those materials in the presence of reactant materials at approximately 400° C. and maintaining the plasma by means of a glow discharge so that a temperature gradient is established through an inner reactant mesh and an outer condensation mesh that collects more manageable interaction by-products. This method contemplates the production of chemical by-products that have a vapor pressure greater than $10^{-3}$ torr at 400° C. and a vapor pressure less than $10^{-2}$ torr at 30° C. The method may further include the step of introducing a reactant gas along with the process effluent and generating a glow discharge to create a plasma at a location adjacent a reactive metal so that a chemical reaction occurs to produce less dangerous by-products. A ballast gas may be introduced to couple radiation from a transmitter to the plasma in order to maintain the plasma in an efficient manner.

Accordingly, the present invention has been described with some degree of particularity directed to the preferred embodiment of the present invention. It should be appreciated, though, that the present invention is defined by the following claims construed in light of the prior art so that modifications or changes may be made to the preferred embodiment of the present invention without departing from the inventive concepts contained herein.

I claim:

1. A method for eliminating corrosive gases from a gas flow line, comprising the steps of:
   combining the corrosive gases with a reactant gas to form a mixed gas product;
   introducing said mixed gas product into the interior of a generally hollow reaction chamber having a reaction element positioned therein wherein said reactant gas and said reaction element are selected to contain material which chemically reacts with the corrosive gases to produce relatively harmless chemical by-products;
   enhancing chemical reaction among the corrosive gases, the reactant gas and the reaction element by creating a plasma in the mixed gas product at a location adjacent the reaction element whereby the temperature environment for the chemical reaction is increased; and
   outletting gaseous chemical by-products from said reaction chamber.

2. The method according to claim 1 wherein said reaction element is maintained at a temperature of 400° C.

3. The method according to claim 2 wherein said chemical by-products are passed through a condensation element positioned in the reaction chamber prior to being outletted from said reaction chamber.

4. The method according to claim 3 wherein said condensation element is maintained at a temperature of approximately 30° C.

5. The method according to claim 1 wherein said plasma is created by inducing a glow discharge by electromagnetic radiation from a transmitter along a waveguide in said reaction chamber.

6. The method according to claim 5 wherein said electromagnetic radiation has a wavelength in the microwave range.

7. The method according to claim 5, including the step of introducing a ballast gas into said mixed gas product to couple said electromagnetic radiation to said plasma.

8. The method according to claim 1, including the steps of monitoring the temperature and pressure of the chemical reaction at said reaction element, adjusting the temperature of the reaction element by controlling the created plasma temperature, and adjusting the composition of said mixed gas product by varying the ratio of corrosive gases and the reactant gas in response to the temperature and pressure whereby chemical reaction of the corrosive gases with the reactant gas and the reaction element is increased.

* * * * *